United States Patent
Imai

(10) Patent No.: US 10,149,404 B2
(45) Date of Patent: Dec. 4, 2018

(54) OPENING AND CLOSING CONTROL SYSTEM AND OPENING AND CLOSING CONTROL APPARATUS

(71) Applicant: DENSO CORPORATION, Kariya, Aichi-pref. (JP)

(72) Inventor: Koji Imai, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 454 days.

(21) Appl. No.: 14/782,290

(22) PCT Filed: Mar. 31, 2014

(86) PCT No.: PCT/JP2014/059552
§ 371 (c)(1),
(2) Date: Oct. 2, 2015

(87) PCT Pub. No.: WO2014/163053
PCT Pub. Date: Oct. 9, 2014

(65) Prior Publication Data
US 2016/0044822 A1 Feb. 11, 2016

(30) Foreign Application Priority Data
Apr. 4, 2013 (JP) ................................. 2013-078677

(51) Int. Cl.
*F28F 27/00* (2006.01)
*H05K 7/20* (2006.01)
(Continued)

(52) U.S. Cl.
CPC ......... *H05K 7/20009* (2013.01); *E05F 15/71* (2015.01); *F28F 13/00* (2013.01); *H05K 7/20209* (2013.01)

(58) Field of Classification Search
CPC .. H05K 7/20009; H05K 7/20136; H05K 7/20; H05K 7/20209; E05F 15/71; F28F 13/00
(Continued)

(56) References Cited

U.S. PATENT DOCUMENTS 6,590,267 B1 7/2003 Goodwin-Johansson et al.
7,222,665 B2 * 5/2007 Ichishi ............... B60H 1/00271
165/202
(Continued)

FOREIGN PATENT DOCUMENTS

JP 56-99898 8/1981
JP S56-099898 U 8/1981
(Continued)

OTHER PUBLICATIONS

International Search Report (translated version); International Application No. PCT/JP2014/059552, filed Mar. 31, 2014; 4 pages.
(Continued)

*Primary Examiner* — Claire Rojohn, III
(74) *Attorney, Agent, or Firm* — Knobbe, Martens, Olson & Bear, LLP

(57) ABSTRACT

An opening and closing control system that controls an operation of an inlet port so that an external environment is detected more accurately and opening and closing of the inlet port is controlled more properly is provided. In the ventilation control system, an internal environment sensor detects an internal environment of a casing, and an external environment sensor is disposed apart from the casing without being in contact with the casing and detects an external environment of the casing which corresponds to the internal environment. Then, a calculation unit obtains the internal environment and the external environment detected by the internal environment sensor and the external environment sensor, and controls opening and closing of a ventilation port (Continued)

in response to difference between the internal environment and the external environment.

11 Claims, 6 Drawing Sheets

(51) Int. Cl.
    *E05F 15/71*    (2015.01)
    *F28F 13/00*    (2006.01)
(58) Field of Classification Search
    USPC ........................................................ 165/291
    See application file for complete search history.

(56) References Cited

U.S. PATENT DOCUMENTS

| | | | | |
|---|---|---|---|---|
| 8,209,059 | B2* | 6/2012 | Stockton | G05B 15/02 700/278 |
| 9,507,393 | B2* | 11/2016 | Alshinnawi | H05K 7/20781 |
| 9,541,299 | B2* | 1/2017 | Sankar | F24F 11/0079 |
| 9,671,839 | B2* | 6/2017 | Peterson | G06F 1/206 |
| 9,835,345 | B2* | 12/2017 | Tseng | F24F 11/0001 |
| 9,870,037 | B2* | 1/2018 | Jenne | G06F 1/26 |
| 2007/0058339 | A1* | 3/2007 | Hoffman | H05K 7/20136 361/688 |
| 2008/0246788 | A1* | 10/2008 | Yamashita | B41J 2/14209 347/9 |
| 2009/0020280 | A1* | 1/2009 | Janek | B60H 1/034 165/202 |
| 2009/0086431 | A1* | 4/2009 | Sakamoto | H05K 7/20009 361/695 |
| 2009/0096842 | A1* | 4/2009 | Kubo | B41J 2/14209 347/68 |
| 2010/0025126 | A1* | 2/2010 | Nakatsu | B60L 11/00 180/65.1 |
| 2010/0290190 | A1* | 11/2010 | Chester | H05K 7/20772 361/701 |
| 2011/0114297 | A1* | 5/2011 | Horng | H01L 23/467 165/121 |
| 2011/0130891 | A1* | 6/2011 | Nielsen | G06F 1/206 700/300 |
| 2012/0287584 | A1* | 11/2012 | Koyama | A61B 5/0031 361/728 |
| 2013/0098599 | A1* | 4/2013 | Busch | H05K 7/20209 165/294 |
| 2013/0135823 | A1* | 5/2013 | Kim | H01L 23/467 361/697 |
| 2013/0233933 | A1* | 9/2013 | Dostmann | F24F 11/0015 236/44 A |
| 2013/0312429 | A1* | 11/2013 | Greuet | F25B 9/14 62/6 |
| 2016/0091938 | A1* | 3/2016 | Edwards | G06F 1/3231 700/300 |

FOREIGN PATENT DOCUMENTS

| | | |
|---|---|---|
| JP | 04007898 A * | 1/1992 |
| JP | H04-004797 U | 1/1992 |
| JP | H04-007898 A | 1/1992 |
| JP | H07-036483 U | 7/1995 |
| JP | H08-222864 A | 8/1996 |
| JP | H11-214879 A | 8/1999 |
| JP | 2003-163477 A | 6/2003 |
| JP | 2004-090875 A | 3/2004 |
| JP | 2004-310238 A | 11/2004 |
| JP | 2005-194392 A | 7/2005 |
| JP | 2008-055981 A | 3/2008 |
| JP | 2009-122483 A | 6/2009 |
| JP | 2010-026838 A | 2/2010 |
| JP | 2010085507 A | 4/2010 |
| JP | 2011-199016 | 10/2011 |
| JP | 2012-000217 A | 1/2012 |
| JP | 2012-018584 A | 1/2012 |
| JP | 2012-087967 A | 5/2012 |
| WO | 2014/163053 A1 | 10/2014 |

OTHER PUBLICATIONS

Copy of International Preliminary Report on Patentability; International Application No. PCT/JP2014/059552; Filed: Mar. 31, 2014 (with English translation).

* cited by examiner (a)

(b)

(a)

(b)

(a)

(b)

(c)

(d)

CLOSED          OPEN (e)

OPENING AND CLOSING CONTROL SYSTEM AND OPENING AND CLOSING CONTROL APPARATUS

TECHNICAL FIELD

The present invention relates to an opening and closing control system and an opening and closing control apparatus that control an operation of an inlet port.

BACKGROUND ART

There is a known opening and closing control apparatus configured to open and close an inlet port in response to a temperature difference between inside and outside of a casing that houses electronic devices (devices which include electronic elements) (for example, see PTL 1).

CITATION LIST

Patent Literature

[PLT 1] JP-UM-A-H04-004797

SUMMARY OF THE INVENTION

Technical Problem

In the opening and closing control apparatus described in PTL 1, there is a risk that a sensor that detects temperature outside the casing is affected by the casing since the sensor is in contact with the casing, and fails to correctly measure the external temperature. Accordingly, an inlet port may not be appropriately opened and closed.

The above problem may occur not only in sensors that detect temperature, but also in any configuration that detects an external environment. In order to overcome such a problem, the present invention has been made to provide an opening and closing control system and an opening and closing control apparatus that control an operation of an inlet port so as to more accurately detect an external environment and more appropriately open and close an inlet port.

Solution to Problem

In an opening and closing control system according to an exemplary embodiment of the present invention, an internal environment detecting section detects an internal environment of a casing, and an external environment detecting section is disposed apart from the casing without being in contact with the casing and detects an internal environment of the casing which corresponds to the internal environment. Then, an environment acquiring section obtains the internal environment and the external environment detected by the internal environment detecting section and the external environment detecting section, and an opening and closing control section controls opening and closing of the inlet port in response to difference between the internal environment and the external environment.

According to the opening and closing control system, the external environment detecting section can be less susceptible to an effect of the presence of the casing when detecting the external environment, and can detect the external environment with high accuracy. Accordingly, opening and closing of the inlet port can be controlled in an appropriate manner.

In order to achieve the above object, a computer may execute an opening and closing control program which serves as functional sections that form the opening and closing control system.

DESCRIPTION OF EMBODIMENTS

With reference to the drawings, embodiments according to the present invention will be described.

First Embodiment

System Configuration

Figure 1:
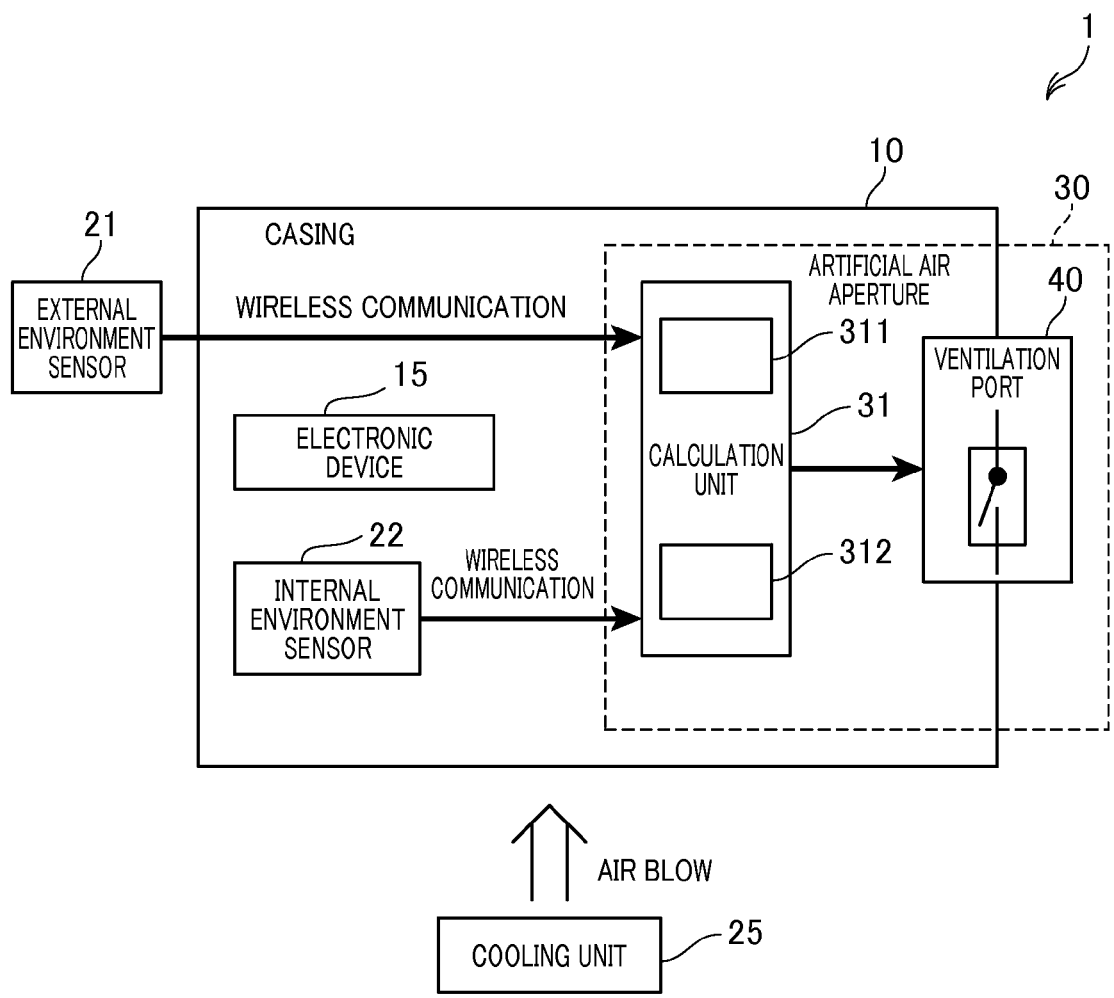
FIG. 1 is a block diagram which shows a schematic configuration of a ventilation control system 1.

As shown in FIG. 1, a ventilation control system 1 (which corresponds to an opening and closing control system) according to a first embodiment of the present invention has a function of appropriately operating an electronic device 15 disposed in a casing 10 at an appropriate temperature by appropriately opening and closing a ventilation port 40 formed on the casing 10.

Specifically, the ventilation control system 1 includes the electronic device 15, an external environment sensor 21 (which corresponds to an external environment detecting section), an internal environment sensor 22 (which corresponds to an internal environment detecting section), a cooling unit 25 (which corresponds to an air-sending section), and an artificial air aperture 30. The electronic device 15, the internal environment sensor 22, and the artificial air aperture 30 are housed, for example, in the casing 10 made of resin.

The casing 10 is placed at a position which is subject to temperature rise due to sunlight, for example, in a vehicle such as a passenger car or in a greenhouse. The electronic device 15 has, for example, a function of processing an image captured by a camera, or a function of controlling various types of equipment such as a room light and an air conditioner.

The electronic device 15 is configured to operate when the electronic device 15 has a temperature of a predetermined guarantee temperature or less and stop the operation when the temperature exceeds the guarantee temperature in order to reduce an adverse effect to the electronic device 15 caused by heat.

The external environment sensor 21 is disposed apart from the casing 10 without being in contact with the casing 10 and detects an air temperature outside the casing 10 as an external environment. The external environment sensor 21 transmits a detection result to a calculation unit 31 disposed in the artificial air aperture 30 via wireless communication (such as radio frequency communication and infrared communication).

The internal environment sensor 22 is disposed in the casing 10 and detects an environment (in this embodiment, air temperature) which is similar to that detected by the external environment sensor 21. Similarly to the external environment sensor 21, the internal environment sensor 22 transmits a detection result to the calculation unit 31 disposed in the artificial air aperture 30 via wireless communication.

The cooling unit 25 generates cool air and sends the cool air to the casing 10 (ventilation port 40). In this embodiment, the cooling unit 25 is configured as an air conditioning apparatus that generates cool air while performing dehumidification.

A plurality of artificial air apertures 30 are formed on the casing 10, and each artificial air aperture 30 includes the calculation unit 31 and the ventilation port 40. The calculation unit 31 and the ventilation port 40 are configured, for example, as micro electro mechanical systems (MEMS). As shown in FIG. 1, in the calculation unit 31, an environment acquiring section 311 having a function of receiving information of the environment (air temperature) which is transmitted from the environment sensors 21, 22 and an opening and closing control section 312 having a function of comparing the information of the environment and opening and closing the ventilation port 40 in response to the comparison result are made by an electronic circuit.

Figure 2:
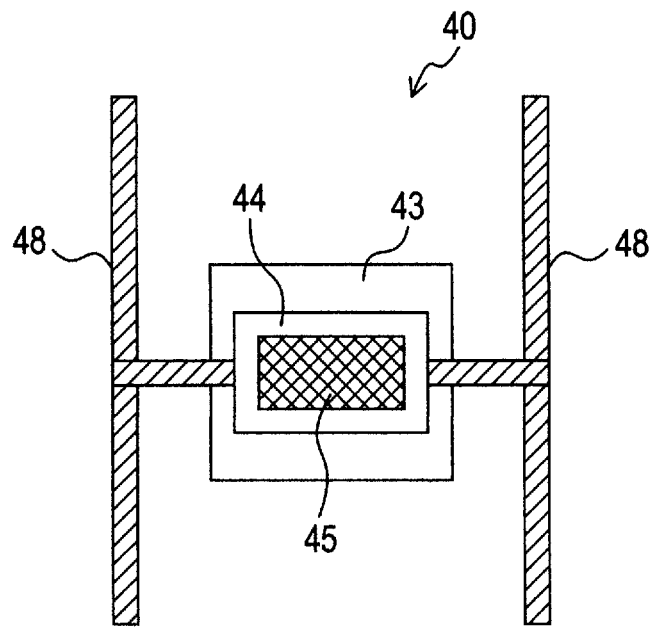
FIG. 2(a) is a plan view and FIG. 2(b) is a sectional view of a ventilation port 40 in a closed state.
Figure 2:
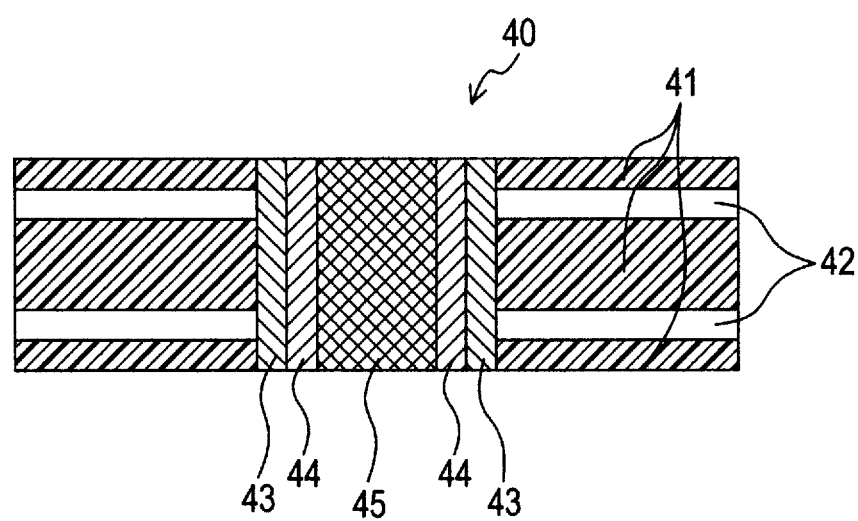

As shown in FIG. 2(*a*), the ventilation port 40 includes a holding section 43, an element section 44 and an opening and closing section 45. The holding section 43 holds the element section 44, and the element section 44 receives electric power supplied from a wiring 48 and actuates the opening and closing section 45.

Figure 3:
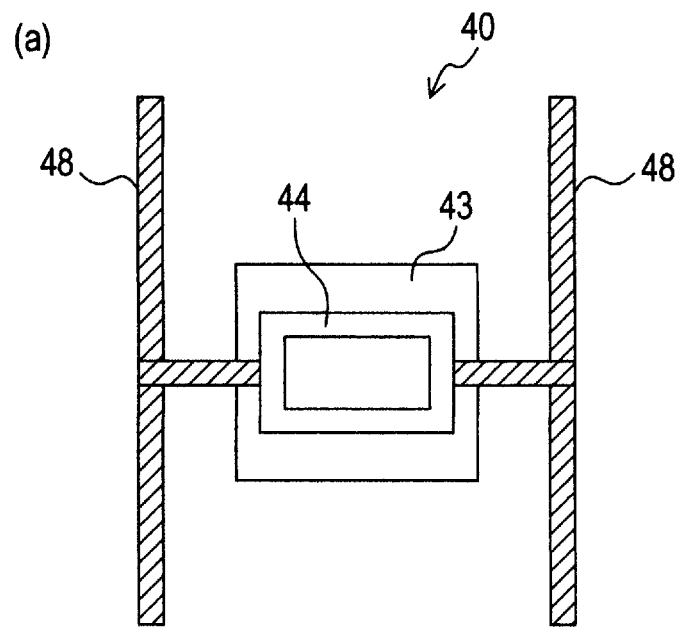
FIG. 3(a) is a plan view and FIG. 3(b) is a sectional view of the ventilation port 40 in an open state.
Figure 3:
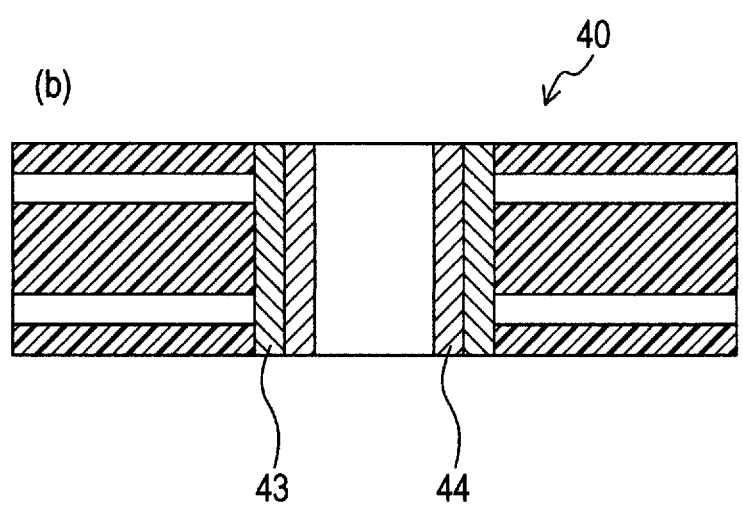

When the opening and closing section 45 is in a closed state, a space surrounded by the element section 44 is closed by the opening and closing section 45 as shown in FIGS. 2(*a*) and 2(*b*), thereby separating the inside and outside of the casing 10. When the opening and closing section 45 is in an open state, a space surrounded by the element section 44 is not closed as shown in FIGS. 3(*a*) and 3(*b*), the inside and outside of the casing 10 are connected (communicate) with each other.

Figure 4:
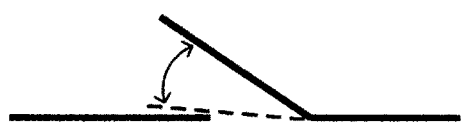
FIGS. 4(a)-4(e) are explanatory views which show different configurations and positions of the ventilation port 40.
Figure 4:
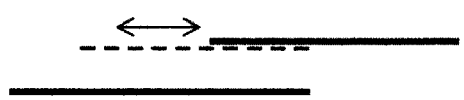
Figure 4:
Figure 4:
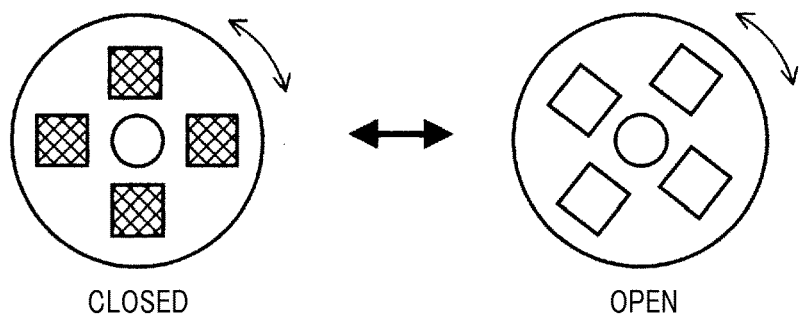
Figure 4:
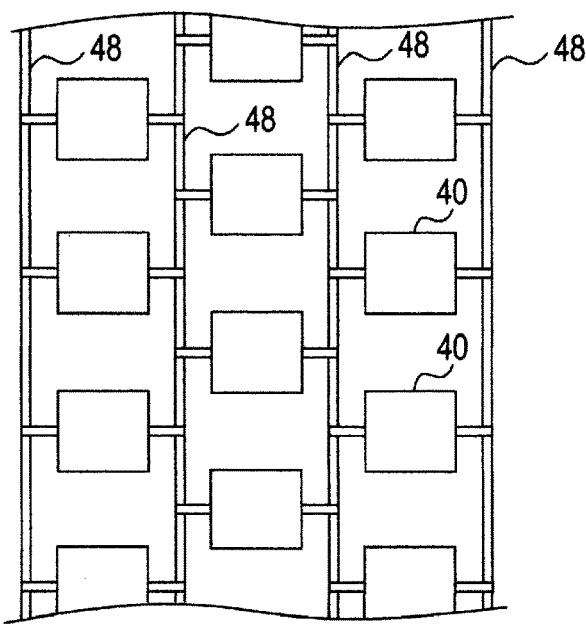

As shown in FIG. 4, specific configuration of the opening and closing section 45 may use various opening and closing types, for example, swing door type (see FIG. 4(*a*)), sliding door type (see FIG. 4(*b*)), folding door type (see FIG. 4(*c*)) and rotary type (see FIG. 4(*d*)).

Processing in First Embodiment

Figure 5:
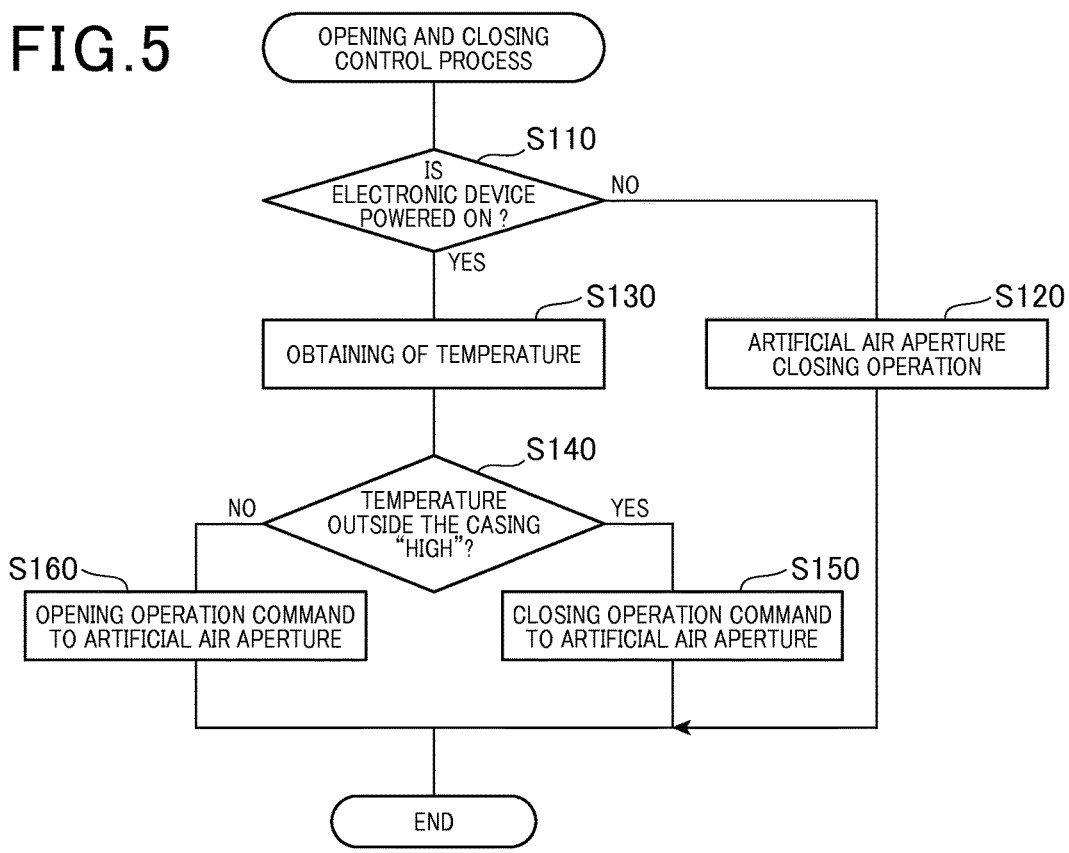
FIG. 5 is a flowchart which shows an opening and closing control process performed by a calculation unit 31 according to a first embodiment.

In the ventilation control system 1 having the above configuration, the calculation unit 31 performs the opening and closing control process which is shown in FIG. 5. The opening and closing control process starts, for example, on applying power to the ventilation control system 1, and controls opening and closing of the ventilation port 40 in response to a temperature difference between inside and outside of the casing 10. The ventilation port 40 is configured to be closed when the ventilation control system 1 is powered off.

The detail of the opening and closing control process is shown in FIG. 5. First, whether the electronic device 15 is powered on or off is determined (S110). The calculation unit 31 is connected to the electronic device 15 via wired or wireless communication, and is configured to monitor an operation state of the electronic device 15.

When the electronic device 15 is powered off (S110: NO), the artificial air aperture 30 (opening and closing section 45) remains closed (S120) and the opening and closing control process ends. When the electronic device 15 is powered on (S110: YES), temperature information is obtained from the internal environment sensor 22 and the external environment sensor 21 (S130).

Then, those temperatures are compared (S140). When the temperature outside the casing 10 (temperature detected by the external environment sensor 21) is higher than the temperature inside the casing (temperature detected by the internal environment sensor 22) (S140: YES), a command is sent to close the artificial air aperture 30 (S150). In response to the command, the artificial air aperture 30 (opening and closing section 45) is closed.

When the temperature outside the casing 10 is lower than the temperature inside the casing (S140: NO), a command is sent to open the artificial air aperture 30 (S160). In response to the command, the artificial air aperture 30 (opening and closing section 45) is open. In so doing, cool air generated by the cooling unit 25 is blown to the casing 10, and the cool air is introduced into the casing 10 via the ventilation port 40.

Figure 6:
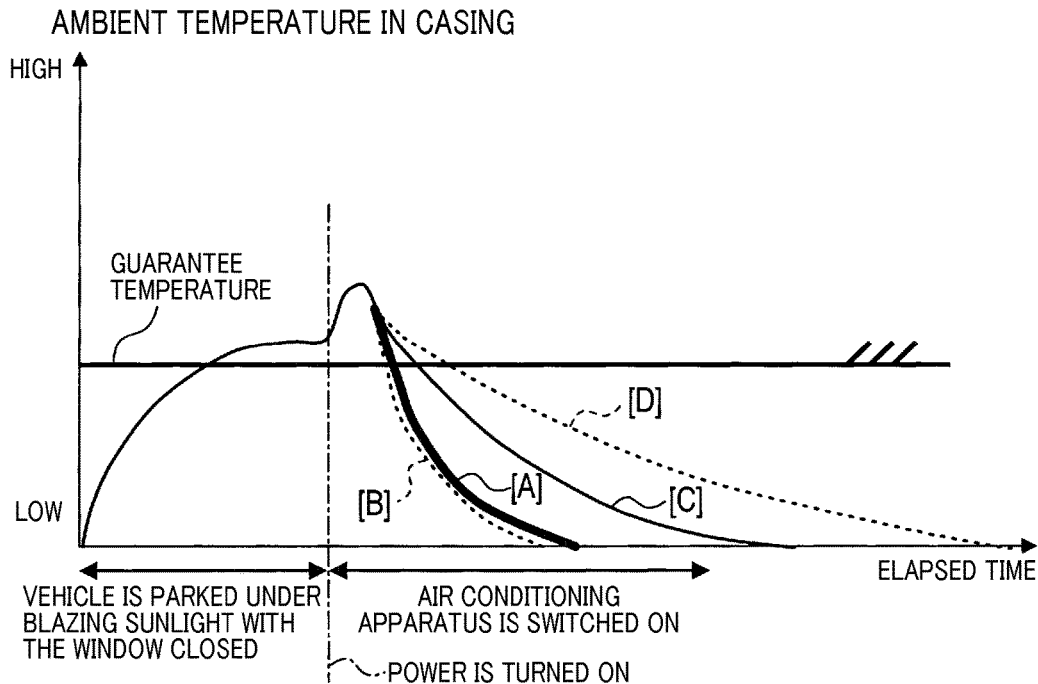
FIG. 6 is a chart which shows an example of change in temperature in the ventilation control system of the first embodiment.

As a result of the artificial air aperture 30 being open and the cool air being introduced into the casing 10 via the ventilation port 40, the temperature in the casing 10 is considered to change, for example, as shown in FIG. 6. That is, when a vehicle is parked under blazing sunlight, the temperature in the casing 10 (ambient temperature in the casing) rises as the time elapses.

Then, when power is applied to the ventilation control system 1 or the electronic device 15, the temperature in the casing 10 temporarily rises due to heat generated by those devices. However, since the cool air is introduced into the casing 10 via the ventilation port 40, the temperature rise is immediately alleviated (see the solid line [A] in FIG. 6). It is revealed that, according to the configuration of this embodiment, the temperature can be rapidly lowered to or below the guarantee temperature compared to the case in which the casing 10 is made of metal and does not have the configuration of this embodiment (see the solid line [C] in FIG. 6) or the case in which the casing 10 is made of resin and does not have the configuration of this embodiment (see the solid line [D] in FIG. 6).

Although the casing 10 of this embodiment is made of resin, the casing 10 may be made of metal. In that case, the amount of heat dissipated from the surface of the casing 10 can be increased, thereby more rapidly lowering the temperature in the casing 10 (see the dashed line [B] in FIG. 6).

When the above steps are completed, the opening and closing control process ends.

In this embodiment, step S130 of the opening and closing control process is performed by the environment acquiring section 311 of the calculation unit 31, and steps S140 to S160 of the opening and closing control process is performed by the opening and closing control section 312.

Advantageous Effect of First Embodiment

In the ventilation control system 1 described in detail above, the internal environment sensor 22 detects the environment inside the casing 10, while the external environment sensor 21 is disposed apart from the casing 10 without being in contact with the casing 10 and detects the environment outside the casing 10 which corresponds to the environment inside the casing 10. Then, the calculation unit 31 obtains the internal environment and the external environment detected by the internal environment sensor 22 and the external environment sensor 21 (S130), and controls opening and closing of the ventilation port 40 in response to the difference between the internal environment and the external environment (S140 to S160). The "environment" inside and outside the casing includes, for example, temperature, humidity, or dew condensation state (presence or absence of water droplets).

According to the above ventilation control system 1, when detecting the external environment, the external environment sensor 21 can be less susceptible to an effect of the presence of the casing 10 and can detect the external environment with high accuracy. Accordingly, opening and closing of the ventilation port 40 can be controlled in an appropriate manner.

Further, in the above ventilation control system 1, the entire surroundings of the external environment sensor 21 is covered by air introduced into the casing 10 via the ventilation port 40.

According to the ventilation control system 1, the external environment sensor 21 can be less susceptible to an effect of heat conduction and radiation heat from the surface of the casing 10. That is, the environment of the external environment sensor 21 and the internal environment sensor 22 can be independent from each other, thereby improving detection accuracy of the environment. Accordingly, the ventilation port 40 can be appropriately open and closed, allowing the environment in which the electronic device 15 is located in the casing 10 to be an environment appropriate for operation of the electronic device 15.

Further, in the ventilation control system 1, the calculation unit 31 obtains the external environment from the internal environment sensor 22 and external environment sensor 21 via wireless communication.

According the ventilation control system 1, since the environment such as temperature and water droplet can be prevented from being transmitted via a cable, the environment sensors 21, 22 can detect the environment more accurately compared to the detection using wired communication.

Further, in the ventilation control system 1, the internal environment sensor 22 and external environment sensor 21 detect the temperature inside and outside the casing 10, respectively, and the calculation unit 31 controls the ventilation port 40 to open when the temperature outside the casing 10 is lower than the temperature inside the casing 10, and controls the ventilation port 40 to close when the temperature outside the casing 10 is higher than the temperature inside the casing 10.

According to the ventilation control system 1, the temperature inside the casing 10 can be prevented from increasing.

Further, the ventilation control system 1 includes the cooling unit 25 that blows air to the casing 10 to cool the casing 10.

According to the ventilation control system 1, air can be blown into the casing 10 when the ventilation port 40 is open, thereby successfully cooling and dehumidifying the inside of the casing 10.

Second Embodiment

The ventilation control system according to a second embodiment of the present invention will be described. In this embodiment, only the difference from the ventilation control system 1 of the first embodiment will be described in detail. The same references are used for the same elements of the ventilation control system 1 of the first embodiment, and the description thereof is omitted.

In the ventilation control system of this embodiment, the external environment sensor 21 and the internal environment sensor 22 shown in FIG. 1 are configured as dew sensors that detect dew condensation state (the amount of dew). The dew sensor can be configured by a known sensor, and can be replaced with a humidity sensor or the like.

Figure 7:
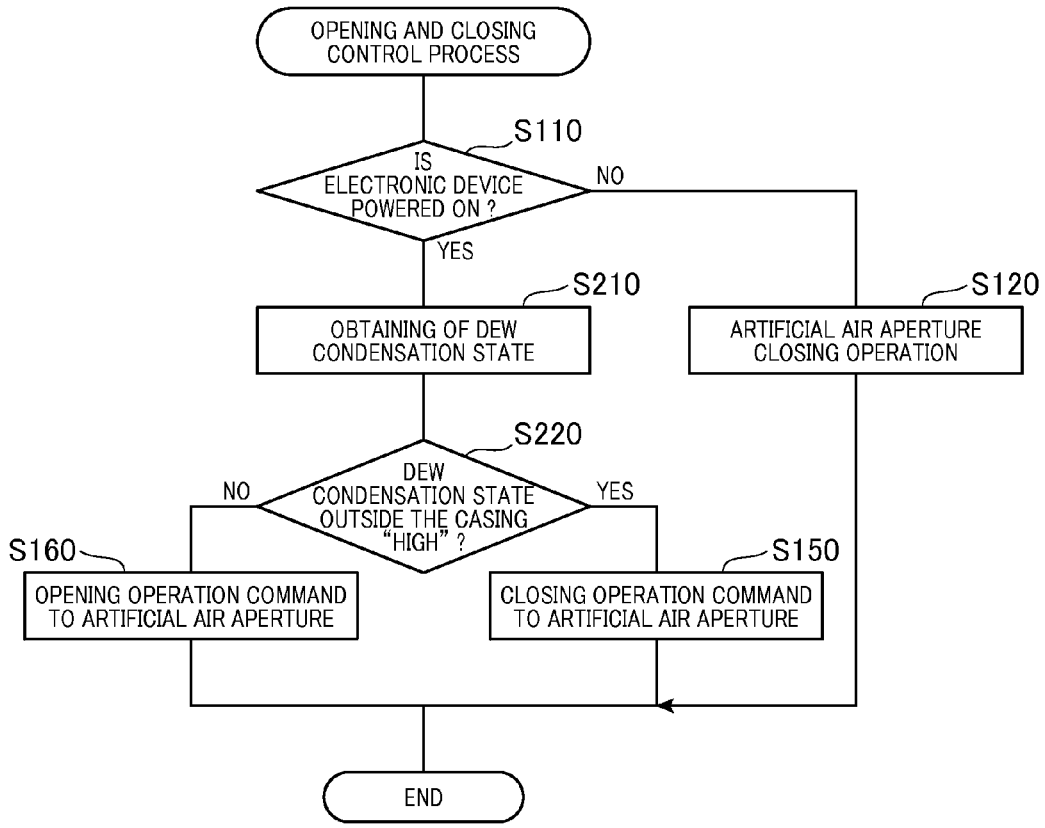
FIG. 7 is a flowchart which shows an opening and closing control process performed by the calculation unit 31 according to a second embodiment.

As shown in FIG. 7, in the opening and closing control process, when the electronic device 15 is powered on in step S110 (S110: YES), dew condensation states are obtained from the external environment sensor 21 and the internal environment sensor 22 (S210) instead of step S130. Then, the dew condensation states are compared (S220) instead of step S140. When the amount of dew condensation in the dew condensation state outside the casing 10 (dew condensation state from the external environment sensor 21) is larger than the amount of dew condensation in the dew condensation state inside the casing (dew condensation state from the internal environment sensor 22) (S220: YES), the process proceeds to step S150. When the amount of dew condensation in the dew condensation state outside the casing 10 (dew condensation state from the external environment sensor 21) is smaller than the amount of dew condensation in the dew condensation state inside the casing (S220: NO), the process proceeds to step S160.

Figure 8:
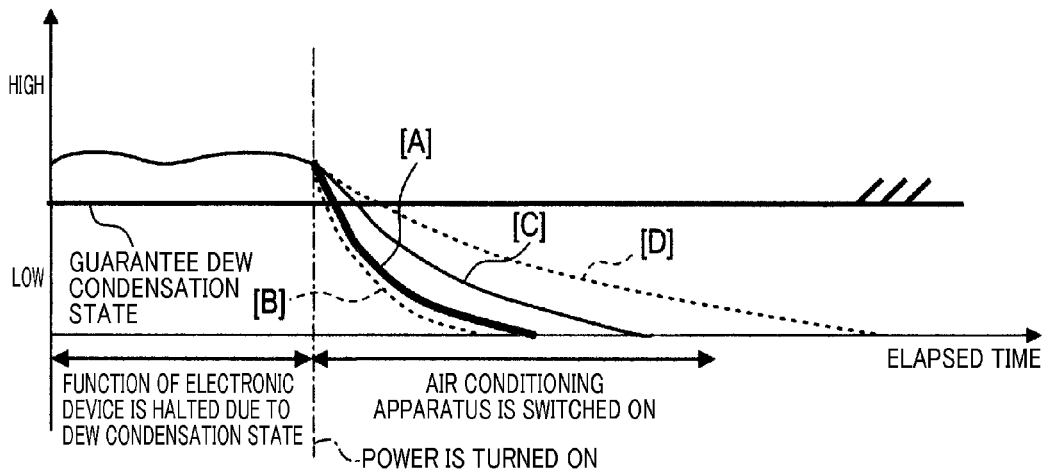
FIG. 8 is a chart which shows an example of dew condensation state in the ventilation control system of the second embodiment.

When the artificial air aperture 30 is open in step S160 and the air of lower dew condensation state (air of lower humidity) is introduced into the casing 10 via the ventilation port 40, the dew condensation state in the casing 10 is considered to change, for example, as shown in FIG. 8. That is, in winter or in the rainy season, the dew condensation state in the casing 10 in a parked vehicle increases.

Then, when power is applied to the ventilation control system 1 or the electronic device 15, dehumidified air is introduced into the casing 10 via the ventilation port 40. As a result, the dew condensation state is immediately alleviated (see the solid line [A] in FIG. 8). It is revealed that, according to the configuration of this embodiment, the dew condensation state can be rapidly alleviated to or below the guarantee condensation state compared to the case in which the casing 10 is made of metal and does not have the configuration of this embodiment (see the solid line [C] in FIG. 8) or the case in which the casing 10 is made of resin and does not have the configuration of this embodiment (see the solid line [D] in FIG. 8).

Although the casing 10 of this embodiment is made of resin, the casing 10 may be made of metal. In that case, substantially the same effect can be obtained (see the dashed line [B] in FIG. 8).

When the above steps are completed, the opening and closing control process ends.

In this embodiment, step S210 of the opening and closing control process is performed by the environment acquiring section 311 of the calculation unit 31, and steps S220 and S150 to S160 of the opening and closing control process is performed by the opening and closing control section 312.

In the ventilation control system of the second embodiment, the internal environment sensor 22 and the external environment sensor 21 detect the dew condensation state inside and outside the casing 10, respectively, and the calculation unit 31 opens and closes the ventilation port 40 in response to the difference in the dew condensation state inside and outside the casing 10.

Particularly, the calculation unit 31 controls the ventilation port 40 to open when the inside of the casing 10 is in the dew condensation state and the outside of the casing 10 is not in the dew condensation state, and controls the ventilation port 40 to close when the inside of the casing 10 is not in the dew condensation state and the outside of the casing 10 is in the dew condensation state.

According to the ventilation control system 1, dew condensation inside the casing 10 can be prevented, and the casing 10 can be dehumidified when dew is condensed in the casing 10.

Other Embodiments

The present invention is not in any way limited to the above embodiment. Further, an embodiment with part of the above configuration omitted while it remains capable of solving the problem is also included in the embodiment of the present invention. Further, an embodiment configured by combining a plurality of the above embodiments as appropriate is also included in the embodiment of the present invention. Any embodiment which could be made without departing from the spirit of the invention as defined solely by the terms in the appended claims is included in the embodiment of the present invention. Although references used in the description of the above embodiment are also used in the appended claims for ease of understanding, it is not intended to limit the technical scope of the invention defined by the appended claims.

For example, in the above embodiment, the artificial air aperture 30 can be positioned in any arrangement, and may be, for example, an array arrangement aligned vertically and horizontally as shown in FIG. 4(e). With this arrangement, since the surface area of the ventilation port 40 can be increased, a fluid outside the casing 10 can be efficiently introduced into the casing.

Further, each of the units that form the ventilation control system 1 can be communicated via any communication method such as wired or wireless communication. Particularly, the calculation unit 31 and the ventilation port 40 can be communicated via wireless communication. Further, although the communication between the external environment sensor 21 and the calculation unit 31, and the communication between the internal environment sensor 22 and the calculation unit 31 in the above embodiment has been described as wireless communication, they may be communicated via wired communication.

When wired communication is used, the external environment sensor 21 may be replaced with an in-cabin air temperature sensor which is commonly used in the existing air conditioner system in vehicle. Further, communication between the external environment sensor 21 and the calculation unit 31 may be replaced with the existing in-vehicle LAN such as CAN and Flexray. With this configuration, the cost for adding the ventilation control system 1 to the existing system can be reduced.

The calculation unit 31 may be disposed outside the artificial air aperture 30, such as outside the casing 10. In this case, the number of the calculation units 31 is smaller than the number of ventilation ports 40, and one calculation unit 31 may control a plurality of ventilation ports 40.

Although the casing 10 in the above embodiment has been described as being made of resin, it may be made of any material such as metal. Further, although the calculation unit 31 may be configured as a circuit, it may also be configured as a computer having a CPU and a memory.

Further, the external environment sensor 21 in the above embodiment is described as being surrounded by air and the air being introduced into the casing 10. However, the configuration is not limited thereto, and any fluid such as water may be introduced into the casing 10. It should be noted that, depending on the fluid to be introduced, waterproof treatment needs to be separately applied to the electronic device 15 and the like.

Further, although the dew condensation state (the state in which dew is formed) is detected in the above embodiment, the state in which dew is likely to be formed (for example, degree of humidity) may be detected so that opening and closing of the ventilation port 40 is controlled in response to the detection result.

Further, although the artificial air aperture 30 is closed when the electronic device 15 is powered off in step S120 in the above embodiment, the artificial air aperture 30 may be open in the same step.

In the embodiments described above, the electronic device 15 can be provided in an appropriate environment.

REFERENCE SIGNS LIST

1 . . . ventilation control system
10 . . . casing
15 . . . electronic device
21 . . . external environment sensor
21 . . . environment sensor
22 . . . internal environment sensor
25 . . . cooling unit
30 . . . artificial air aperture
31 . . . calculation unit
40 . . . ventilation port
43 . . . holding section
44 . . . element section
45 . . . opening and closing section
48 . . . wiring

What is claimed:

1. An opening and closing control system that controls operations of a plurality of inlet ports formed on a casing and positioned in an array arrangement aligned vertically and horizontally so as to be openable; the opening and closing control system being mounted in a vehicle and comprising:
   an internal environment sensor configured to detect an internal environment of the casing;
   an external environment sensor that is disposed apart from the casing without being in contact with the casing and configured to detect an external environment of the casing which corresponds to the internal environment of the casing, the external environment sensor being configured as part of an air conditioner system in the vehicle;
   a controller configured to:
      receive information of the internal environment and the external environment detected by the internal environment sensor and the external environment sensor; and
      control opening and closing of the inlet ports in response to difference between the internal environment and the external environment; and
   an air-sending section configured to send cool air generated in the air conditioner system to the casing.

2. The opening and closing control system according to claim 1, wherein the external environment sensor is at least partially surrounded by a fluid which is introduced into the casing through the inlet ports.

3. The opening and closing control system according to claim 1, wherein the controller is configured to receive information of the external environment from the external environment sensor via wireless communication.

4. The opening and closing control system according to claim 1, wherein the internal environment sensor and the external environment sensor each detect an internal temperature of the casing and an external temperature of the casing, respectively, and the controller controls the inlet ports to open when the external temperature of the casing is lower than the internal temperature of the casing, and controls the inlet ports to close when the external temperature of the casing is higher than the internal temperature of the casing.

5. The opening and closing control system according to claim 1, wherein the internal environment sensor and the external environment sensor each detect a dew condensation state inside the casing and a dew condensation state outside the casing, and the controller operates to open and close the inlet ports in response to difference between the dew condensation state inside the casing and the dew condensation state outside the casing.

6. The opening and closing control system according to claim 5, wherein the controller controls the inlet ports to open when an inside of the casing is in a dew condensation state and an outside of the casing is not in a dew condensation state, and controls the inlet ports to close when the inside of the casing is not in a dew condensation state and the outside of the casing is in a dew condensation state.

7. An opening and closing control apparatus that controls operations of a plurality of inlet ports formed on a casing and positioned in an array arrangement aligned vertically and horizontally so as to be openable, the opening and closing control apparatus being incorporated in an opening and closing control system mounted in a vehicle, the apparatus comprising:
an internal environment sensor configured to detect an internal environment of the casing;
an external environment sensor that is disposed apart from the casing without being in contact with the casing and configured to detect an external environment of the casing which corresponds to the internal environment of the casing, the external environment sensor being configured as part of an air conditioner system in the vehicle; and
an air-sending section configured to send cool air generated in the air conditioner system to the casing,
wherein the apparatus further comprises:
a controller configured to:
receive the internal environment and the external environment detected by the internal environment sensor and the external environment sensor; and
control inlet ports in response to difference between the internal environment and the external environment.

8. The opening and closing control system according to claim 1, wherein the controller is an electronic circuit or a computer having a CPU and a memory.

9. The opening and closing control apparatus according to claim 7, wherein the controller is an electronic circuit or a computer having a CPU and a memory.

10. An opening and closing control system that controls operations of a plurality of inlet ports formed on a casing and positioned in an array arrangement aligned vertically and horizontally so as to be operable; the opening and closing control system being mounted in a vehicle and operably connected to an air conditioner system of the vehicle, the opening and closing system comprising:
an internal environment sensor configured to detect an internal environment of the casing; and
a controller including an electric circuit or a computer having a CPU and a memory;
wherein
the controller further includes an environment acquiring section connected via wired or wireless communication to an external environment sensor of the air conditioner system,
the external environment sensor is disposed apart from the casing without being in contact with the casing and is configured to detect an external environment of the casing;
the controller configured to:
receive information of the internal environment detected by the internal environment sensor and the external environment acquired via the environment acquiring section; and
control, by the electronic circuit or the computer, opening and closing of the inlet ports in response to difference between the internal environment and the external environment; and
if the internal environment is higher than the external environment, open the inlet ports to introduce cool air generated in the air conditioner system to the casing.

11. An opening and closing control apparatus that controls operations of a plurality of inlet ports formed on a casing and positioned in an array arrangement aligned vertically and horizontally so as to be operable; the opening and closing control apparatus being incorporated in an opening and closing control system mounted in a vehicle and operably connected to an air conditioner system of the vehicle, the opening and closing control system including an internal environment sensor configured to detect an internal environment of the casing, wherein
the opening and closing control apparatus includes:
an electric circuit or a computer having a CPU and a memory;
an environment acquiring section connected via wired or wireless communication to an external environment sensor of the air conditioner system,
the external environment sensor is disposed apart from the casing without being in contact with the casing and is configured to detect an external environment of the casing,
the opening and closing control apparatus is configured to:
receive information of the internal environment detected by the internal environment sensor and the external environment acquired via the environment acquiring section; and
control, by the electronic circuit or the computer, opening and closing of the inlet ports in response to difference between the internal environment and the external environment; and
if the internal environment is higher than the external environment, open the inlet ports to introduce cool air generated in the air conditioner system to the casing.

* * * * *